United States Patent [19]

Sano et al.

[11] 4,193,798
[45] Mar. 18, 1980

[54] PROCESS FOR PRODUCING PRINTING RESIN PLATES USING LIQUID PHOTOSENSITIVE RESINS

[75] Inventors: Takezo Sano, Takatsuki; Tadanori Inoue, Ibaragi, both of Japan

[73] Assignee: Sumitomo Chemical Company, Limited, Osaka, Japan

[21] Appl. No.: 801,789

[22] Filed: May 31, 1977

Related U.S. Application Data

[63] Continuation of Ser. No. 584,355, Jun. 6, 1975, abandoned.

[30] Foreign Application Priority Data

Jun. 21, 1974 [JP] Japan .................................. 49-71480

[51] Int. Cl.² .......................... G03C 5/00; G03B 27/04
[52] U.S. Cl. ...................................... 430/300; 355/85; 430/306; 430/496; 430/531; 430/285
[58] Field of Search ............... 96/35.1, 36.3, 69, 87 R, 96/115 R; 355/85; 427/141

[56] References Cited

U.S. PATENT DOCUMENTS

| | | | |
|---|---|---|---|
| 3,663,222 | 5/1972 | Akamatsu et al. | 96/35.1 |
| 3,813,162 | 5/1974 | Watabe et al. | 355/85 |
| 3,848,998 | 11/1974 | Yonekura et al. | 355/100 |
| 3,858,510 | 1/1975 | Kai et al. | 96/35.1 |
| 3,859,091 | 1/1975 | Wessells et al. | 96/36.3 |

FOREIGN PATENT DOCUMENTS 49-3705 of 1974 Japan .
431039 5/1974 U.S.S.R. .

OTHER PUBLICATIONS

Neblette, "Photography, Its Materials and Processes", Sixth Ed., 1962, pp. 152-153.

Primary Examiner—Jack P. Brammer
Attorney, Agent, or Firm—Stevens, Davis, Miller & Mosher

[57] ABSTRACT

A printing resin plate is produced by adoption of such process and apparatus that a negative film is placed on a transparent plate positioned on a frame stand; a liquid photopolymerizable resin is applied through a cover film onto said negative film to form a layer; the frame stand and/or a means having a belt, which has been extended between at least two rolls and which can rotate synchronously with the frame stand, are moved to insert a support into a space between the liquid photopolymerizable resin layer on the frame stand and the lower surface of said belt; the frame stand is moved to below the lower surface of the belt while pressing the support with the lower surface of the belt by the downward pressure of the belt thereby closely adhering the support onto the liquid photopolymerizable resin layer; and then the liquid photopolymerizable resin layer is exposed to light.

5 Claims, 2 Drawing Figures

PROCESS FOR PRODUCING PRINTING RESIN PLATES USING LIQUID PHOTOSENSITIVE RESINS

This is a continuation of application Ser. No. 584,355 filed June 6, 1975 now abandoned.

This invention relates to a process and an apparatus for producing printing resin plates using liquid photopolymerizable resins. Preparation of image reliefs using photopolymerizable resins is useful in various fields since optional and precise images can be obtained when negative films are used.

Printing resin plates, particularly relief printing resin plates, using liquid photopolymerizable resins are ordinarily produced in such a manner that a negative film (generally, a negative film has been covered with a transparent thin cover film), which has been adhered onto a plate transparent to active light, e.g. a glass plate, is faced at a definite interval to a material (support) which fixes and supports an image relief; a liquid photopolymerizable resin layer having a definite thickness is formed in a space between the negative film and the support, while adhering the layer to at least the support; an active light is irradiated from the glass plate side through the negative film to the photopolymerizable layer for a definite period of time to cure the liquid photopolymerizable resin at portions exposed to said light; and thereafter the liquid resin at the unexposed portions is removed to obtain a relief printing resin plate, which, if necessary, is then further irradiated with an active light to sufficiently carry out the photopolymerization.

In the step of forming a liquid photopolymerizable resin layer, among the above-mentioned platemaking steps, there have heretofore been adopted various processes in order that a liquid resin layer having a definite thickness can be formed in a definite area while avoiding the resin layer from migration of air bubbles. As such processes, there have been proposed, for example, a process in which a liquid photopolymerizable resin is introduced by injection or absorption into a space between a negative film adhered to a glass plate and a support distanced at a definite interval from said negative film by means of a spacer or the like, and a process in which a support, which has been curved by means of a roll or the like, is closely adhered by pressing onto a liquid resin flowed and spread on a negative film, which has been covered with a cover film and which has been placed on a flat glass plate. According to these processes, the liquid resin layer is adhered onto both the support and the negative film (in most cases, the negative film has been covered with a cover film). However, there has also been proposed a process in which a liquid resin layer having a definite thickness is adhered only to the support, and the negative film is distanced at a definite interval from the liquid resin layer.

Printing resin plates produced by use of photopolymerizable resins can give optional precise images, as mentioned previously, and hence have frequently been utilized in the field of printing. For use as printing materials, however, the printing resin plates are required to be high in flatness. When such high flatness is desired to be provided, there are brought about such problems that a step is additionally required, another apparatus is required to be installed, the plate-making time becomes longer, or the apparatus is made complex. Further, in using the printing resin plates as printing materials, there are the cases where they are used as they are as the printing materials and the cases where they are used as original plates for matrixes, and it is the actual state that not only the compositions of the liquid resins are varied but also the materials of the supports are selected from a wide scope of materials such as rubbers, cloths and metals, and the plate-making processes are also changed accordingly.

With an aim to overcome the above-mentioned problems encountered in producing printing resin plates by use of liquid photopolymerizable resins, the present inventors made extensive studies to find an extremely useful process.

An object of the present invention is to provide a process in which a printing resin plate favorable in flatness, adhesion to support and the like properties can be produced easily and stably.

Another object of the invention is to provide an apparatus suitable for practicing the above-mentioned process.

Other objects and advantages of the invention will become apparent from the following description.

In accordance with the present invention, there is provided a process for producing a printing resin plate which comprises the steps in which a negative film is placed on a transparent plate positioned on a frame stand; a liquid photopolymerizable resin is applied through a cover film onto said negative film to form a layer; the frame stand and/or a means having a belt, which has been extended between at least two rolls and which can rotate synchronously with the frame stand, are moved to insert a support into a space between the liquid photopolymerizable resin layer on the frame stand and the lower surface of said belt; the frame stand is moved to below the lower surface of the belt while pressing the support with the lower surface of the belt by the downward pressure of the belt, thereby closely adhering the support onto the liquid photopolymerizable resin layer; and then the liquid photopolymerizable resin layer is exposed to light.

BRIEF DESCRIPTION OF THE DRAWING

An embodiment of the present invention is illustrated in detail below with reference to FIG. 1. In FIG. 1, a frame stand 1 horizontally moves on a rail 2. On the frame stand 1, a plate 3 transparent to active light, e.g. a glass plate is disposed. On the transparent plate 3, a negative film 4 is placed and is supported, together with a cover film 5, on the transparent plate 3. The frame stand 1 may be moved either by hand or by means of a motor. A press roll 6 acts to closely ahere a support 7 to a liquid photopolymerizable resin 8. A belt-supporting roll 9 supports a belt 10 extended between said roll and the press roll, and acts to make, together with the press roll, the belt 10 to maintain its flatness.

Figure 1:
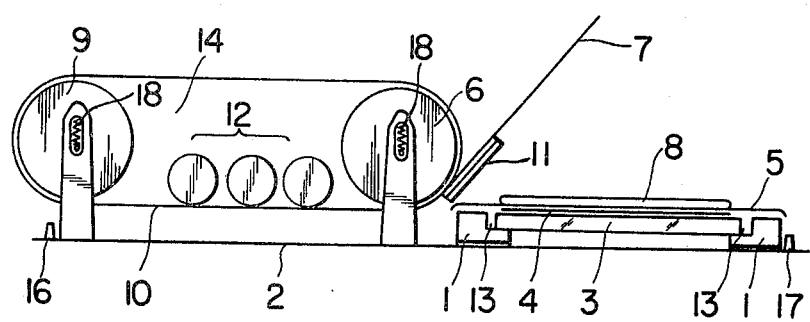
FIG. 1 shows an apparatus and printing resin plate produced therewith.

The press roll 6 serves to form on the support 7 a liquid resin layer 8 having a definite thickness, so that the surface thereof should be sufficiently smooth so as to form a uniform resin layer. The press roll 6 and the belt-supporting roll 9 are different in function, and hence are not always required to be identical in size. The rotation speed of the belt 10 should be synchronized with the moving speed of the frame stand. For this purpose, there may be adopted any of such procedure that only the frame stand is driven, and the belt is synchronously rotated due to the abrasion between the support on the frame stand and the lower surface of the belt, or that the belt 10 is autonomically rotated at the same speed as that of the frame stand 1.

The belt 10, which is extended between the press roll 6 and the belt-supporting roll 9, should be made of a material that can provide a power sufficient to send the support 7, which has been closely adhered to the liquid resin layer 8, to below the lower surface of the belt, synchronously with the rotation of the belt 10 and the movement of the frame stand 1. As such material, there is used any of rubber, cloth or metal or a composite thereof.

When the frame stand 1 touches limit switches 16 and 17, the movement of the frame stand 1, and the rotations of the rolls 6 and 9 and of the belt 10 stop.

In order that the adhesion and flatness of the support 7 and the liquid resin layer 8 at below the lower surface of the belt 10 can be maintained more completely, it is also effective to make such device that one or more rolls 12 are additionally interposed between the rolls 6 and 9, the belt 10 is made air-permeable, or a space 14 surrounded by the belt 10 is maintained under reduced pressure.

A process using an apparatus which has been so deviced as mentioned above is explained below.

A glass plate 3 high in flatness which is about 10 mm. in thickness is placed on the frame stand 1. On the glass plate are fixed a negative film 4 bearing a desired image and on the frame stand is fixed a spacer 15 having a definite thickness (refer to FIG. 2). The thickness of the image relief of a printing resin plate is regulated by the said spacer 15. Generally, the thickness of the spacer 15 is in the range of 0.3 to 10 mm. in case the resulting printing resin plate is desired to be used for printing of newspapers and the like. Subsequently, the negative film 4 is covered with a cover film 5 (10 to 20μ in thickness), and air inside the system is discharged through a gap 13 provided between the frame stand 1 and the glass plate 3 to extend and adhere the cover film 5 onto the glass plate 3. Thereafter, a liquid photopolymerizable resin is flowed on the thus adhered cover film 5 to definite thickness and area to form a liquid resin layer 8. The thickness and area of the liquid resin layer may be freely decided according to the use purpose of the resulting printing resin plate. However, in order to prevent the layer from entrainment of air at the time of adhesion to the support and to make easily provide flatness with less movement of the liquid photopolymerizable resin, the thickness of liquid resin layer is preferably 1 to 1.1 times the thickness of the spacer. For formation of such liquid resin layer 8, a doctor knife or the like may be used. After forming the liquid resin layer 8 in the above-mentioned manner, the frame stand 1 is moved at a definite speed to the left of FIG. 1 along the rail 2. The speed of movement of the frame stand 1 is synchronized with the rotation speed of the belt 10, and is about 10 to 100 cm/sec. When the liquid resin layer 8 has reached the press roll 6 due to movement of the frame stand 1, the support 7 is sent, along the surface of the press roll 6, to below the lower surface of the belt, and is adhered to the liquid resin layer 8. In this case, a downward pressure is applied to each of the rolls 6 and 9 by means of, for example, a spring 18, so that the liquid resin layer can have an accurate thickness regulated by the spacer 15. The above-mentioned pressure varies depending on the viscosity of the liquid resin and the moving speed of the frame stand 1, but it is sufficient that the pressure is 1 to 5 kg. per lineal cm of each roll. In the above manner, the liquid resin layer 8 having a definite thickness which has adhered to the support 7 is formed below the lower surface of the belt 10 with movement of the frame stand 1 and with rotation of the belt 10. When the frame stand 1 touches the limit switch 16, the movement thereof stops and, at the same time, the rotation of the belt 10 also stops. Successively, an active light, for example, a light disposed from ultraviolet fluorescent lamp or a high pressure mercury lamp is irradiated for a definite period of time, for example, 30 sec. to 60 min., preferably 1 to 15 min. from the lower part of the glass plate 3 to the liquid resin layer 8. Subsequently, the frame stand 1 moves synchronously with the rotation of the belt 10 to the right of FIG. 1 by the working of a time switch (not shown). When the frame stand 1 touches the limit switch 17, the movement thereof stops and, at the same time, the rotation of the belt 10 also stops. Thereafter, the discharge of air from the gap 13 is ceased, and the system is returned to atmospheric pressure. Further, the cover film 5 is removed from the liquid resin layer 8, and then unirradiated portions of the liquid resin layer 8 are removed to obtain a printing resin plate having a desired image relief formed on the support 7.

In the above, the present invention has been explained in detail with reference to an embodiment, but the invention is not limited only to the said embodiment but includes such procedures that the frame stand is fixed, and the means, which has the press roll, the belt-supporting roll, and the belt extended between the two rolls, is moved; and that both of the frame stand and the means having the belt extended between said two rolls are moved.

The liquid photopolymerizable resin used in the present invention includes an unsaturated polyester resin or unsaturated polyurethane resin, which have a viscosity of less than 10,000 cps preferably 5,000 to 500 cps at room temperature.

As explained above, according to the present invention, a printing resin plate excellent in preciseness of thickness can be produced in a short period of time by use of a liquid photopolymerizable resin. Thus, the present invention is extremely useful from the industrial standpoint.

Figure 2:
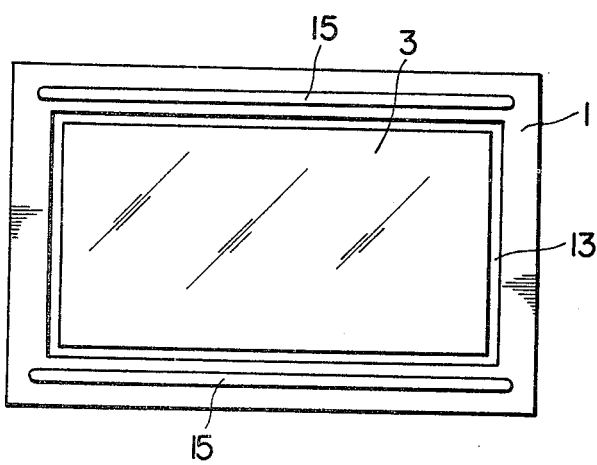
FIG. 2 shows a top view of the printing resin plate on the frame stand.

FIG. 1 is a lateral view showing an example of the apparatus of the present invention; and FIG. 2 is a plane view of the frame stand used in the present invention.

In the drawings, 1 is a frame stand, 2 is a rail, 3 is a glass plate, 4 is a negative film, 5 is a cover film, 6 is a press roll, 7 is a support, 8 is a liquid photopolymerizable resin, 9 is a beltsupporting roll, 10 is a belt, 11 is a guide plate, 12 is a roll, 13 is a gap, 14 is a space, 15 is a spacer, 16 and 17 are limit switches, and 18 is a spring.

What is claimed is:

1. A process for producing a printing resin plate which comprises the steps of placing a negative film on a transparent plate positioned on a frame stand having a pair of horizontally separated spacers;

applying a transparent cover film on said negative film;

applying a liquid photopolymerizable resin on said cover film within the limits of said pair of horizontally separated spacers;

applying a support on said photopolymerizable resin layer by introducing a support between the resulting assembly on said frame stand and a means having a belt that has been extended between at least two rolls thus having an upper surface and a lower surface and which can rotate synchronously with said frame stand and (1) moving said resulting assembly on said frame stand or (2) moving said means having a belt or (3) moving said resulting assembly on said frame stand and said means having a belt together, so that the assembly on said frame stand is moved to below the lower surface of the belt while pressing the support with the lower surface of the belt by the downward pressure thereof, thereby closely adhering the support onto said photopolymerizable resin layer;

exposing said liquid photopolymerizable resin layer to light;

removing the resulting photopolymerizable resin plate from said frame stand, and removing the unexposed areas from the resulting photopolymerized resin layer.

2. A process according to claim 1, wherein the thickness of the layer of the liquid photopolymerizable resin is 1 to 1.1 times the thickness of the spacer.

3. A process according to claim 1, wherein the moving speed of the frame stand is 10 to 100 cm/sec.

4. A process according to claim 1, wherein the pressing pressure of the roll is 1 to 5 kg. per unit lineal cm of the roll.

5. A process according to claim 1 further comprising discharging air through a gap between said frame stand and said transparent plate, thereby extending and adhering said negative film and said cover film onto said transparent plate.

* * * * *